US009591786B2

(12) United States Patent
Sueyoshi et al.

(10) Patent No.: US 9,591,786 B2
(45) Date of Patent: Mar. 7, 2017

(54) ELECTRONIC DEVICE FOR VEHICLE

(71) Applicant: DENSO CORPORATION, Kariya, Aichi-pref. (JP)

(72) Inventors: Tetsuya Sueyoshi, Okazaki (JP); Tsubasa Kawashita, Chiryu (JP); Ichiro Yoshida, Takahama (JP); Kiyohiko Sawada, Nagoya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/763,844

(22) PCT Filed: Nov. 8, 2013

(86) PCT No.: PCT/JP2013/006581
§ 371 (c)(1),
(2) Date: Jul. 28, 2015

(87) PCT Pub. No.: WO2014/136157
PCT Pub. Date: Sep. 12, 2014

(65) Prior Publication Data
US 2015/0382502 A1  Dec. 31, 2015

(30) Foreign Application Priority Data
Mar. 4, 2013  (JP) .................. 2013-041904

(51) Int. Cl.
*H05K 7/20* (2006.01)
*H05K 5/00* (2006.01)

(52) U.S. Cl.
CPC ....... *H05K 7/20136* (2013.01); *H05K 5/0004* (2013.01); *H05K 7/20863* (2013.01); *H05K 7/20972* (2013.01)

(58) Field of Classification Search
CPC ...... G06F 3/0488; G06F 1/28; G06F 3/04883; G06F 1/30; G06F 1/08; G06F 3/0481;
(Continued)

(56) References Cited

U.S. PATENT DOCUMENTS 5,721,933 A * 2/1998 Walsh ................... G06F 1/1632
307/31
2001/0028678 A1  10/2001 Kato et al.
(Continued)

FOREIGN PATENT DOCUMENTS

JP   H11-194858 A    7/1999
JP   2001-344045 A   12/2001
(Continued)

OTHER PUBLICATIONS

International Search Report and Written Opinion of the International Searching Authority mailed Jan. 21, 2014 for the corresponding international application No. PCT/JP2013/006581 (and English translation).

*Primary Examiner* — Adam B Dravininkas
(74) *Attorney, Agent, or Firm* — Posz Law Group, PLC

(57) ABSTRACT

An electronic device for a vehicle includes: a digital substrate having a first semiconductor package with a CPU, a second semiconductor package with a volatile memory readable and writable from the CPU, a third semiconductor package with a flash memory storing a start-up program of the CPU, and a fourth semiconductor package with a power supply management integrated circuit; and a fan that takes in air along the surface of the digital substrate on which the first to fourth semiconductor packages are mounted. The third semiconductor package is disposed to distance from the first semiconductor package by at least a first predetermined distance and to distance from the fourth semiconductor package by at least a second predetermined distance exceeding the first predetermined distance, and is disposed in a passage of the air taken in by the fan.

4 Claims, 6 Drawing Sheets

(58) Field of Classification Search
CPC .... G06F 3/04842; G06F 15/7842; G06F 1/26; H05K 7/1492; H05K 7/1489; H05K 7/1487; H05K 7/1488
See application file for complete search history.

(56) References Cited

U.S. PATENT DOCUMENTS

| | | | | |
|---|---|---|---|---|
| 2001/0033475 | A1* | 10/2001 | Lillios | G06F 1/1632 |
| | | | | 361/679.54 |
| 2007/0180264 | A1* | 8/2007 | Ni | H05K 5/0269 |
| | | | | 713/186 |
| 2008/0048716 | A1* | 2/2008 | Balasubramanian | G06F 1/08 |
| | | | | 326/38 |
| 2008/0266816 | A1* | 10/2008 | Ni | H05K 5/0269 |
| | | | | 361/737 |
| 2009/0086431 | A1* | 4/2009 | Sakamoto | H05K 7/20009 |
| | | | | 361/695 |
| 2009/0171613 | A1* | 7/2009 | Tsukazawa | G06F 1/203 |
| | | | | 702/130 |
| 2009/0295458 | A1* | 12/2009 | Kameyama | G05F 3/227 |
| | | | | 327/512 |
| 2009/0323272 | A1 | 12/2009 | Iijima et al. | |
| 2010/0023678 | A1 | 1/2010 | Nakanishi et al. | |
| 2010/0301924 | A1 | 12/2010 | Kameyama et al. | |
| 2011/0204957 | A1 | 8/2011 | Kameyama et al. | |
| 2014/0181479 | A1* | 6/2014 | Sasanka | G06F 9/30098 |
| | | | | 712/220 |
| 2014/0327630 | A1* | 11/2014 | Burr | G06F 3/0488 |
| | | | | 345/173 |

FOREIGN PATENT DOCUMENTS

| | | |
|---|---|---|
| JP | 2006-352849 A | 12/2006 |
| JP | 2007-172076 A | 7/2007 |
| JP | 2009-176147 A | 8/2009 |
| JP | 2012-155760 A | 8/2012 |
| WO | 2007/091655 A1 | 8/2007 |

* cited by examiner

ELECTRONIC DEVICE FOR VEHICLE

CROSS REFERENCE TO RELATED APPLICATION

This application is a U.S. national stage of International Application No. PCT/JP2013/006581 filed on Nov. 8, 2013 and is based on Japanese Patent Application No. 2013-41904 filed on Mar. 4, 2013, the disclosures of which are incorporated herein by reference.

TECHNICAL FIELD

The present disclosure relates to an electronic device for a vehicle.

BACKGROUND ART

An electronic device for a vehicle has, for example, a CPU, a volatile memory, and a flash memory, and carries out various kinds of processing relating to various kinds of vehicle. In recent years, a flash memory is used for storing a start-up program for starting up an electronic device for a vehicle. The flash memory is a rewritable memory, and in recent years, stored data can be rewritten after the flash memory is mounted on a substrate (for example, refer to Patent Literature 1).

PRIOR ART LITERATURES

Patent Literature

Patent Literature 1: JP 2009-176147 A

SUMMARY OF INVENTION

The ambient operating temperature of various kinds of component is raised in a vehicle (for example, an automobile), and the deteriorating speed of the flash memory increases more. If consideration is not given to the thermal environment of each individual component in the vehicle, the component will be damaged, and an electronic instrument will become unusable, before the lifespan of the vehicle expires. In case where a heat radiating device such as a CPU or a power supply management IC is mounted on the same substrate, and where a volatile memory is further mounted on the same substrate, if a flash memory is indiscriminately mounted on the substrate, the deteriorating speed of the flash memory becomes faster, and the lifespan of the flash memory is shortened.

An object of the disclosure is to provide an electronic device for a vehicle, in which a semiconductor package with a flash memory is disposed at an appropriate position on a multilayer digital substrate having a multiple of semiconductor packages respectively with a CPU, a volatile memory, a flash memory, and a power supply management IC, whereby the lifespan of the flash memory can be increased.

According to an aspect of the present disclosure, an electronic component is mounted to a multilayer digital substrate, and includes the first to fourth semiconductor packages respectively with a CPU, a volatile memory, a flash memory, and a power supply management IC. A fan takes in air along a surface of the digital substrate on which the first to fourth semiconductor packages are mounted. Because the third semiconductor package is disposed to distance from the first semiconductor package by at least a first predetermined distance and to distance from the fourth semiconductor package by at least a second predetermined distance, the effect of heat generated by the CPU and the power supply management IC can be minimized. Also, as the third semiconductor package is disposed in a passage of the air taken in by the fan, the third semiconductor package can be efficiently cooled.

The second semiconductor package with the volatile memory and the third semiconductor package with the flash memory are disposed to distance within a predetermined distance on a concentric circle along a periphery of the first semiconductor package with the CPU. The communication distance between the CPU and the volatile memory can be reduced to the minimum, and the communication distance between the CPU and the flash memory can also be reduced to the minimum.

A lead pin of the third semiconductor package is disposed to distance from a metal piece. Therefore, working is easy, for example when an operator electrically connects a probe to the lead pin and rewrites the data stored in the flash memory.

As air passes through an air vent in the digital substrate, a fifth semiconductor package on an interface substrate can be cooled.

DESCRIPTION OF EMBODIMENTS

Figure 1:
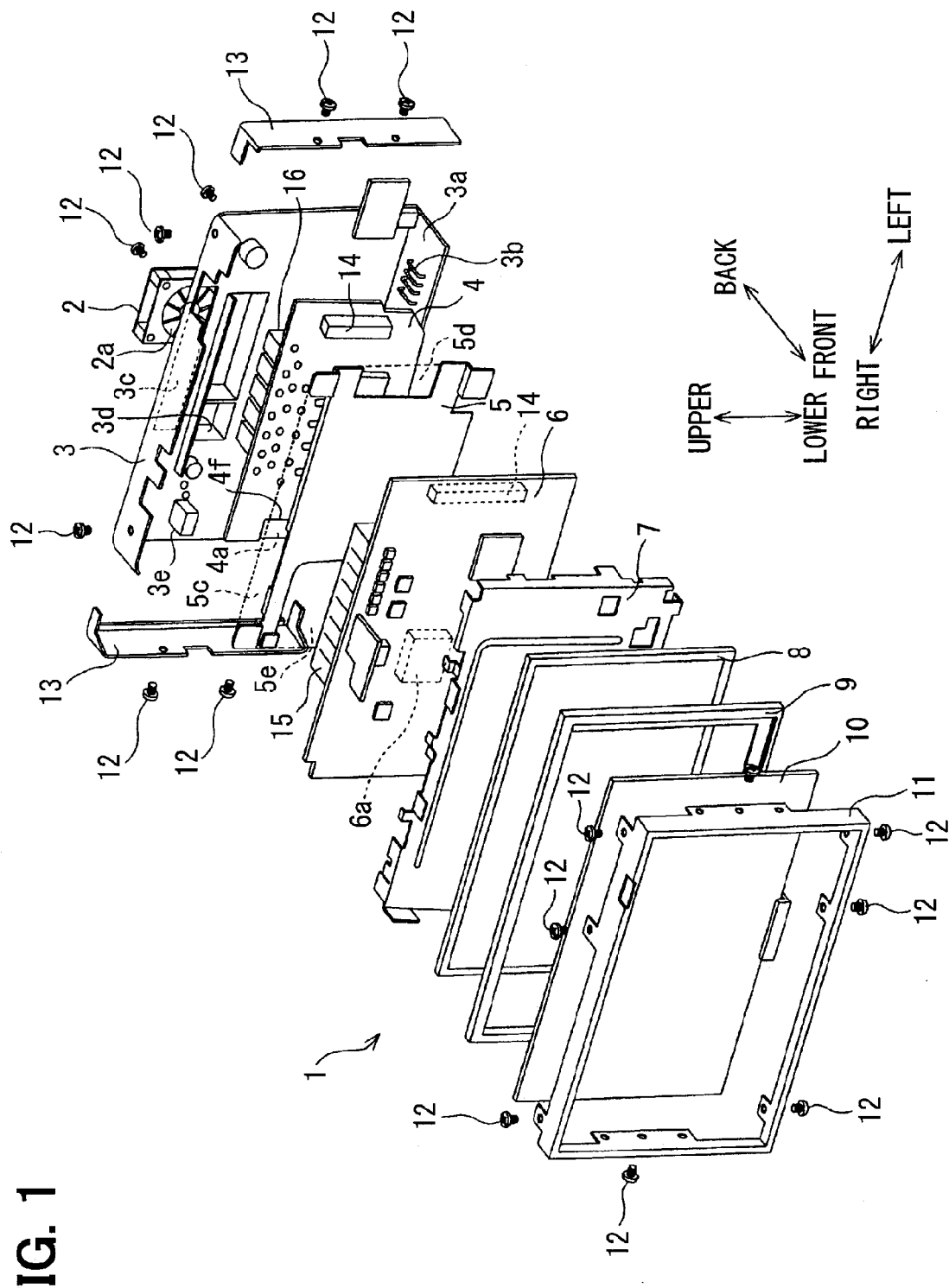
FIG. 1 is an exploded perspective view schematically showing an electronic device for a vehicle according to an embodiment from the front side.

An embodiment of the disclosure will be described referring to FIG. 1 to FIG. 11. As shown in FIG. 1, an electronic device 1 for a vehicle has a back cover 3 made of metal at the backmost portion. A centrifugal fan unit 2 is mounted to the back cover 3. A printed circuit board (digital substrate) 4 to which a digital circuit is mounted, an inter-substrate frame 5, a printed circuit board (interface substrate) 6 to which an interface circuit is mounted, a top frame 7, a liquid crystal display (LCD) 8, an intermediate retaining frame 9, a touch panel 10, and an external frame 11 are assembled, in this order, using screws 12, positioned on the front side of the back cover 3. Side plates 13 are assembled on the lateral sides using screws 12.

Of these parts, the touch panel 10, the LCD 8, the top frame 7, the interface substrate 6, the inter-substrate frame 5, and the digital substrate 4 are parts having approximate plate form, which are stacked in the previously mentioned order while being separated by an appropriate distance from each other in the thickness direction (stacking direction), excluding parts for assembly such as the screws 12.

The external frame 11 on the front side has a rectangular frame form. The inner side of the external frame 11 forms a display region of the LCD 8, and is provided as an operating region of the touch panel 10. The touch panel 10 has a rectangular form, and is disposed on the inner back side of the external frame 11, with a user operating panel as the front side. The LCD 8 is disposed on the back side of the touch panel 10. The top frame 7 is molded into a predetermined form using a metal member, and is disposed on the back side of the LCD 8.

The interface substrate 6 is disposed on the back side of the top frame 7. The interface substrate 6 mainly carries out interfacing with various other kinds of vehicle-mounted instrument (not shown), and furthermore, is mounted with a power supply part (not shown) and used as a power supply substrate. While apertures (cutouts, refer to 4a and 5e of FIG. 1) are provided in the right side edges of the inter-substrate frame 5 and the digital substrate 4, to be described hereafter, the interface substrate 6 has no aperture in the same plane region The interface substrate 6 is formed of a multilayer printed circuit board. Also, electronic parts, such as various kinds of semiconductor package 6a (refer to FIG. 1) for carrying out a power supply control function or various kinds of control dedicated to vehicle control, are mounted on the interface substrate 6.

A Bluetooth (registered trademark) communication unit or interface unit (IF) that carries out interfacing with various kinds of vehicle-mounted instrument (not shown), a CAN driver, a microcomputer that carries out input/output control with a vehicle-mounted instrument, a NOR flash memory, an ND converter (ADC), a D/A converter (DAC), a video decoder, an LED driver for driving a backlighting LED, an analog selector, and the like, are mounted on the interface substrate 6. Although not shown, the interface substrate 6 is configured so as to be electrically connectable to a battery, an external camera (R camera, S camera), a DVD/DTV/etc., a DCM (Data Communication Module), a Bluetooth (registered trademark) antenna, a vehicle network (CAN), a microphone, and the like, and realizes interfacing functions using these.

Figure 4:
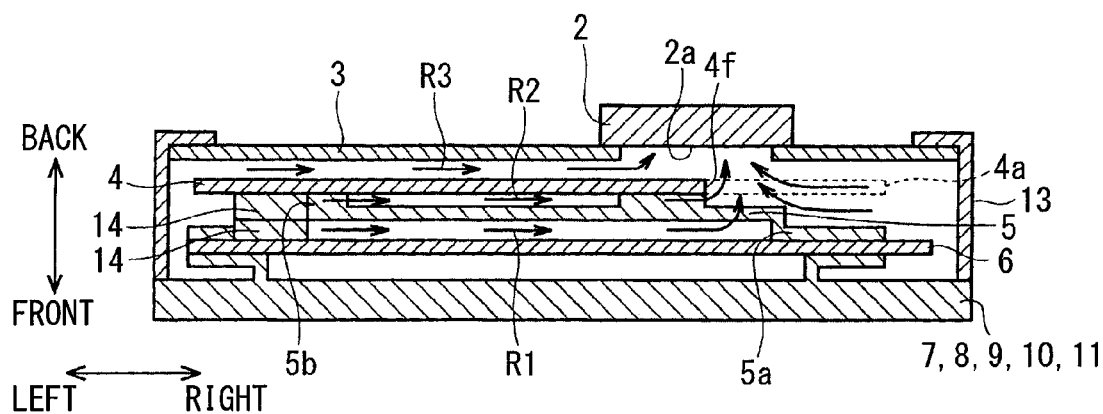
FIG. 4 is a cross-sectional view showing an arrangement of substrates after assembly.

As shown in FIG. 1 and FIG. 4, a connector (board-to-board connector) 14 is mounted on the back surface of the interface substrate 6. The connector 14 is also mounted on the digital substrate 4 so as to oppose the connector 14 of the interface substrate 6. The connectors 14 structurally connect electrical wiring of the interface substrate 6 and electrical wiring of the digital substrate 4, thereby electrically connecting parts mounted on the digital substrate 4 and on the interface substrate 6. The interface substrate 6 and the digital substrate 4 are separated from each other by the height of the connectors 14, whereby the distance between the substrates is secured.

Also, as shown in FIG. 1, multiple connectors 15 are disposed along the inner side of an upper end edge of the interface substrate 6. The multiple connectors 15 are provided with a connection end protruding backward through an aperture 3c of the metal back cover 3, and cause electrical connect to another vehicle-mounted instrument (not shown) provided behind the electronic device 1. The inter-substrate frame 5 is disposed on the back side of the interface substrate 6. The inter-substrate frame 5 is configured by molding a metal member.

As shown in FIG. 4, the inter-substrate frame 5 includes a leg portion 5a standing in a forward direction and a leg portion 5b standing in a backward direction as fixing pieces molded to end portions of the inter-substrate frame 5. The leg portion 5a is fixed to the back surface of the interface substrate 6, while the leg portion 5b is fixed to the front surface of the digital substrate 4. Therefore, the interface substrate 6 and the digital substrate 4 are disposed maintaining a predetermined interval in the thickness direction, and are configured so that air flows along the front and back surfaces of the inter-substrate frame 5 to pass between the leg portion 5a and the leg portion 5b. The inter-substrate frame 5 has a screw hole (not shown) provided in an adhesion portion of the leg portion 5a, and the inter-substrate frame 5 is fastened between the digital substrate 4 and the interface substrate 6 using the screw 12.

As shown in FIG. 1, apertures 5c, 5d, and 5e are provided in an upper end edge, a left-side end edge, and a right-side end edge respectively of the inter-substrate frame 5. The upper end edge aperture 5c is provided for the multiple connectors 15 mounted on the interface substrate 6 to pass through. Also, the left-side end edge aperture 5d is provided for the connector 14 to pass through. Also, the right-side end edge aperture 5e is provided in practically the same plane region as the aperture 4a in the right-side end of the digital substrate 4, to be described hereafter. The right-side end edge aperture 5e is cut out to be slightly large in comparison with the other apertures 5c and 5d.

The digital substrate 4 is disposed on the back side of the inter-substrate frame 5. The digital substrate 4 and the interface substrate 6 are disposed to distance and practically in parallel. A multilayer (for example, ten layers) printed circuit board is used for the digital substrate 4.

Figure 2:
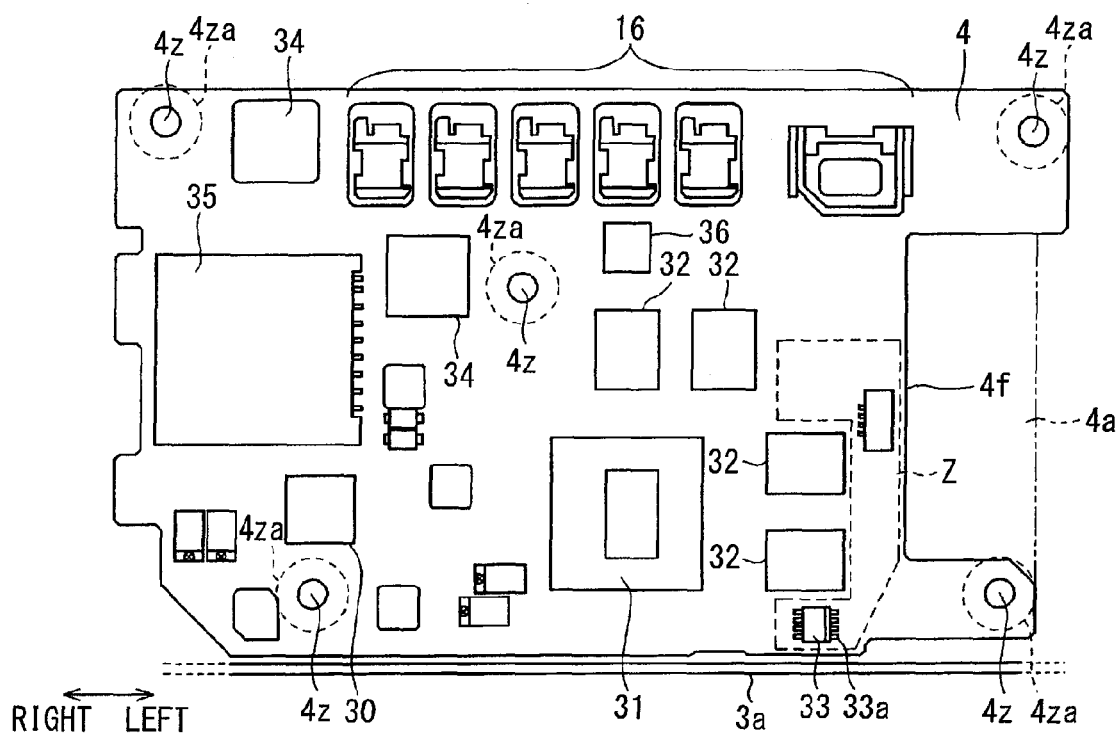
FIG. 2 is a view showing an arrangement of components on a back surface of a multilayer digital substrate.

As shown in FIG. 2, various kinds of electronic part, such as semiconductor package parts for mainly multimedia use and digital data processing use, are mounted on the back surface of the digital substrate 4. The electronic parts include a power supply management integrated circuit (PMIC) 30, a main CPU 31, four DDR2 (Double-Data-Rate2) SDRAMs (Synchronous Dynamic Random Access Memories) 32, a flash memory 33, an image processing ASIC (application specific integrated circuit) 34, an external memory connector 35, an LVDS (Low Voltage Differential Signaling) circuit 36, various kinds of input/output interface connector 16, including a transmitting and receiving connector for the LVDS and a USB (Universal Serial Bus) input/output connector, and the like. The DDR2 SDRAM 32 corresponds to a volatile memory.

As shown in FIG. 2, the PMIC 30, the main CPU 31, the DDR2 SDRAM 32, the flash memory 33, and the image processing ASIC 34 are each incorporated in a separate semiconductor package. Therefore, when describing electrically hereafter, the description will be given with reference signs attached to the previously mentioned names. When describing mechanical distribution or thermal characteristics, as in the characteristics of the application, a description of semiconductor package will be given as being that of a semiconductor package 30, a semiconductor package 31, a semiconductor package 32, a semiconductor package 33, a semiconductor package 34, and the like, attaching the same reference signs as those of the electrical function parts. The semiconductor package 30 corresponds to a fourth semiconductor package. The semiconductor package 31 corresponds to a first semiconductor package. The semiconductor package 32 corresponds to a second semiconductor package. The semiconductor package 33 corresponds to a third semiconductor package. The semiconductor package 6a corresponds to a fifth semiconductor package.

As the semiconductor package 31 includes the main CPU, the semiconductor package 31 generates heat because of carrying out high speed data processing. Because the PMIC 30 monitors the power supply in order to carry out power saving in the main CPU 31, the semiconductor package 30 also generates heat. That is, the semiconductor package 30 and the semiconductor package 31 are mounted as two main heat generating sources on the digital substrate 4, and data stored in the flash memory 33 have to be protected from the heat generating sources.

As the DDR2 SDRAM 32 frequently carries out high speed communication processing with the main CPU 31, a multiple of the semiconductor package 32 are disposed on the immediate lateral periphery of the semiconductor package 31. As the flash memory 33 is a storage medium that stores the start-up program of the electronic device 1, the semiconductor package 33 is disposed immediately laterally adjacent to the semiconductor package 31 with the main CPU, for the same reason as that previously described.

The inventors consider the previously described short distance installation conditions and the conditions for cooling the semiconductor package 31 using the fan 2. Furthermore, the inventors measure the temperature distribution of the digital substrate 4 when the semiconductor package 31 operates under a maximum load. As shown in the plan view of FIG. 2, the inventors have found an arrangement possible region Z of the semiconductor package 33 in which it is possible to arrange the semiconductor package 33.

As shown in FIG. 2, the aperture 4a is provided in the left-side edge of the digital substrate 4. The aperture 4a is an air vent hole, as will be described hereafter, and is an aperture necessary in order to efficiently cool the digital substrate 4 and the interface substrate 6. The arrangement possible region Z of the semiconductor package 33 is positioned on the inner side of an inner edge 4f of the aperture 4a. Two of the DDR2 SDRAM 32 are provided side by side along the upper edge of the main CPU 31, and furthermore, two of the DDR2 SDRAM 32 are provided side by side in the up-and-down direction beside the left-side edge of the CPU 31, whereby four of the DDR2 SDRAM 32 are arrayed.

The arrangement possible region Z of the semiconductor package 33 extends in the up-and-down direction, on the inner side of the end edge 4f of the digital substrate 4, and is further positioned above and below the two DDR2 SDRAM 32 on the left side of the main CPU 31.

Furthermore, the arrangement possible region Z is set within a predetermined distance between concentric circles in a plane. That is, when the inventors consider the electrical characteristics, it is desirable that communication wiring length from the DDR2 SDRAM 32 and the flash memory 33 to the main CPU 31 is short. It has been confirmed that it is desirable that the semiconductor packages 32 and 33 are disposed within a predetermined distance in a concentric circle centered on the semiconductor package 31. The previously mentioned "distance" refers to the length of internal wiring inside the multilayer digital substrate 4.

Conversely, when the thermal aspect is considered, in case where the flash memory 33 is susceptible to heat, it is desirable that the semiconductor package 33 is disposed to distance and separated from the semiconductor package 31 in which the main CPU is mounted by at least a predetermined distance (corresponding to a first predetermined distance). As it is desirable to consider a trade-off between the two, according to the embodiment, the arrangement possible region Z of the semiconductor package 33 has been found to be as shown in FIG. 2.

Figure 3:
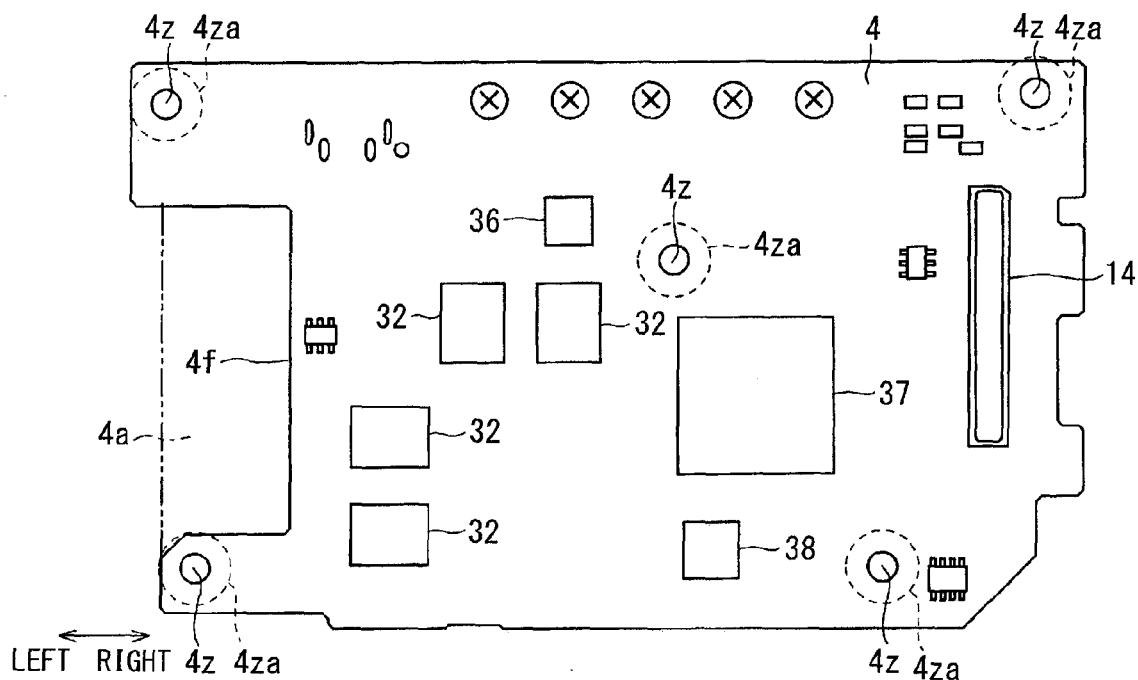
FIG. 3 is a view showing an arrangement of components on a front surface of the multilayer digital substrate.

As shown in FIG. 3 illustrating the parts mounted on the front surface of the digital substrate 4, semiconductor packages of the DDR2 SDRAM 32, the LVDS circuit 36, an input/output interface circuit (IOH) 37, and a CGIC (Clock Generator Integrated Circuit) 38 are disposed on the front surface of the digital substrate 4.

Four of the semiconductor package 32 on the front surface of the digital substrate 4 are disposed at positions opposing the semiconductor packages 32 on the back surface of the digital substrate 4 across the substrate 4. The main CPU 31 communicates with the DDR2 SDRAM 32 disposed on the front surface of the digital substrate 4 via multilevel wiring inside the digital substrate 4. Also, the LVDS circuit 36 on the front surface of the digital substrate 4 is disposed opposing the LVDS circuit 36 on the back surface across the substrate 4.

The front and back LVDS circuits 36 configure a receiver and a transmitter, and are disposed in proximity to the connector 16. The CGIC 38 supplies a clock signal to an electronic part that needs a clock. Because the input/output interface circuit (IOH) 37 is connected by a bus to the main CPU 31, the semiconductor packages 31 and 37 are disposed in proximity to each other across the substrate 4. The input/output interface circuit 37 is electrically connected to both the peripheral circuit 34 and the LVDS circuit 36.

In addition, although not shown, electronic parts such as various kinds of transistor, resistance part, chip capacitor, and the like, are also disposed on the front surface and the back surface of the digital substrate 4. The semiconductor packages 30 to 34 and 36 to 38, the other electronic part 35, and the like, are disposed to distance from a fixing screw hole 4z by a predetermined distance or more (refer to a range 4za), whereby arrangement possible spaces are filled on both the front surface and the back surface of the digital substrate 4.

That is, when the electrode soldering portion of the various kinds of electronic part is disposed near the screw hole 4z, stress acts on the soldering portion when assembling. Therefore, it is not desirable to solder a component near the screw hole 4z, and thus no electronic part is disposed within the predetermined range 4za on the periphery of the screw hole 4z.

As previously described, the aperture (cutout) 4a is included in the right-side end edge of the digital substrate 4, and the aperture 4a is provided in order to allow air to pass through in the thickness direction of the digital substrate 4. As shown in FIG. 4, an air inlet 2a of the centrifugal fan unit 2 is disposed to overlap with one-half of the right-end edge 4f of the digital substrate 4 in a plane. That is, as the air inlet 2a of the centrifugal fan unit 2 is disposed to overlap with one-half of the aperture 4a of the digital substrate 4, the air path formed by the centrifugal fan unit 2 is in principle approximately one-half. Alternatively, the air inlet 2a may be disposed on the outer side of the right-end edge 4f.

Figure 5:
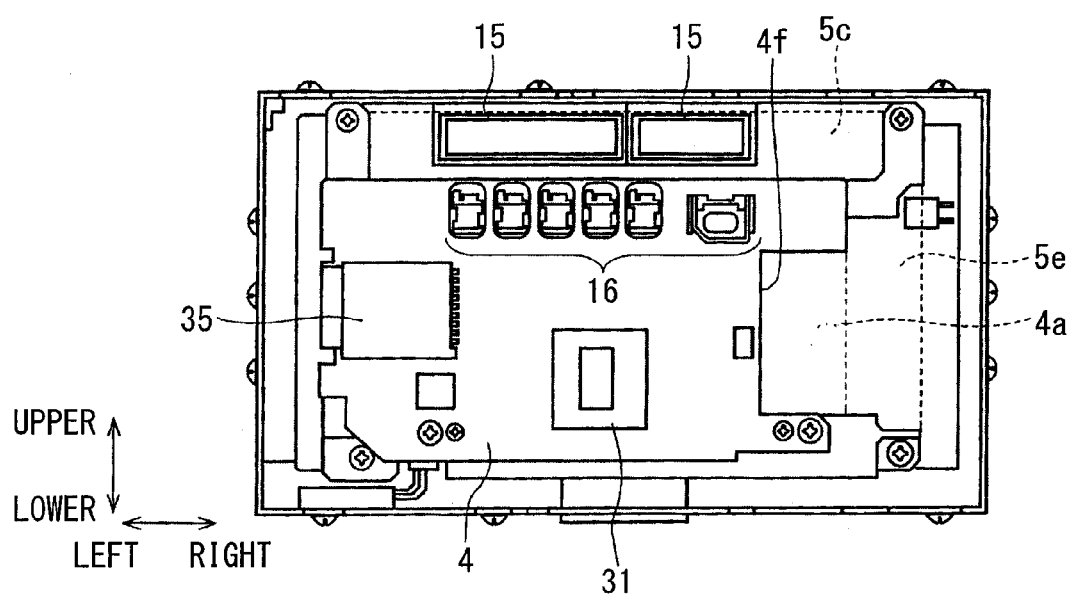
FIG. 5 is a back view schematically showing the multilayer digital substrate from the back surface side.
Figure 6:
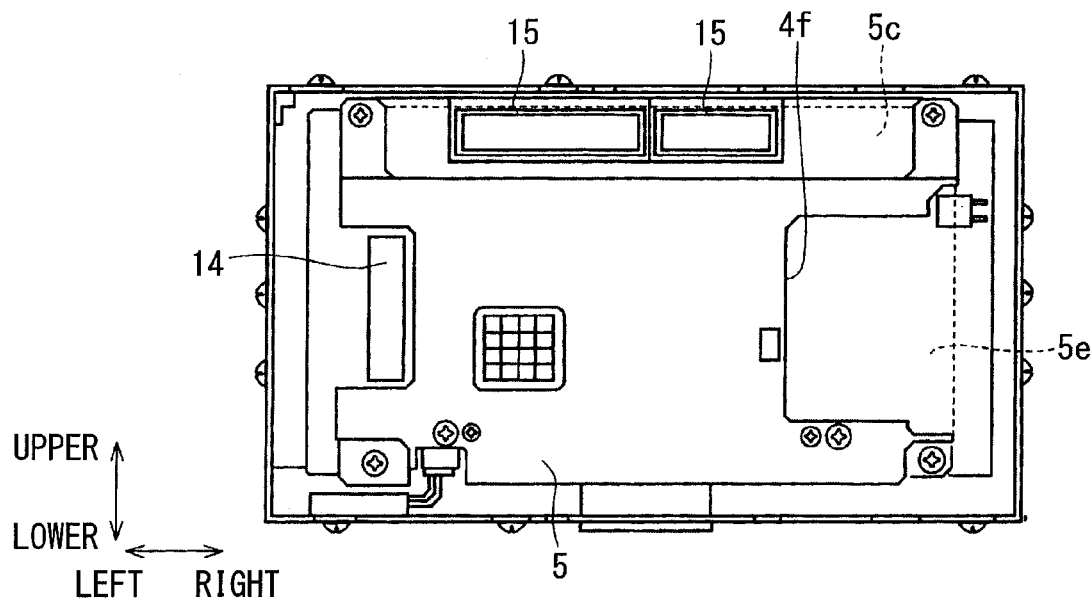
FIG. 6 is a back view schematically showing an inter-substrate frame from the back surface side.

As shown in FIG. 5 and FIG. 6, the up-and-down width of the digital substrate 4 is set to be smaller than the up-and-down width of the interface substrate 6. The upper end edge of the digital substrate 4 is disposed so as to fit inside the inter-substrate frame 5. A multiple of the vehicle connector 16 are disposed on the digital substrate 4 along the upper end edge of the digital substrate 4. The connector 16 protrudes from the back surface of the digital substrate 4, and is disposed in order to electrically connect to another electronic device for a vehicle via wiring (not shown) disposed on the back surface (rear) side.

As previously described, a multiple of the connector 15 are disposed along the upper end edge of the interface substrate 6. As shown in FIG. 5 and FIG. 6, the connector 16 disposed on the back surface of the digital substrate 4 is positioned immediately below the connector 15 mounted on the interface substrate 6. The connector 16 is provided in order to connect the electrical configuration of the digital substrate 4 to various kinds of electrical block, such as a navigation device, an audio device, and an external connection box (AUXBox) (none shown).

As shown in FIG. 1, the back cover 3 is disposed on the back side of the digital substrate 4. The back cover 3 is molded so that the upper end portion and the lower end portion of the rectangular flat plate are bent forward (refer to bent portion 3a). An air inlet 3b is provided in the bent portion 3a at the lower end portion of the back cover 3. A multiple of the air inlet 3b provided in the lower end portion of the back cover 3 have slit form, and are positioned on the left side of the bent portion 3a. The thickness direction (front-to-back direction, forward to back direction) corresponds to the longitudinal direction of the slit form. Air flows from the air inlet 3b and passes between the substrates 4 and 6 and the inter-substrate frame 5. The back cover 3 has an aperture (not shown in FIG. 1) that allows air from the centrifugal fan unit 2 to pass through in a metal member on the back side, and the centrifugal fan unit 2 is fixed on the back side of the aperture of the back cover 3.

The back cover 3 has the aperture 3c along the upper end edge of a back plate. Furthermore, an independent aperture 3d is provided in the back cover 3 along the lower side of the aperture 3c. Each of the apertures 3c and 3d is provided so that the longitudinal direction thereof corresponds to the left-to-right direction.

The aperture 3c along the upper end edge of the back plate of the back cover 3 is provided as an aperture for allowing the connector 15 mounted on the interface substrate 6 to pass through. The aperture 3d provided independently along the lower side of the aperture 3c is provided as an aperture for allowing the connector 16 mounted on the digital substrate 4 to pass through.

The connectors 16 and 15 respectively mounted on the interface substrate 6 and the digital substrate 4 are larger in the thickness direction than other semiconductor parts (IC packages such as the CPU). Because of this, if the connectors 16 and 15 are disposed adjacent to the center of the substrates 4 and 6 (for example, the digital substrate 4), there is concern that the air path will be blocked. According to the embodiment, the connectors 16 and 15 are disposed in two rows along the upper end edge of each rectangle substrates 4 and 6. Therefore, the air path can be provided in the center, whereby ventilation performance can be improved.

The connectors 16 and 15 may be disposed in one row in the left-to-right direction on the interface substrate 6 and the digital substrate 4, provided that space for disposing the connectors 16 and 15 can be secured in the left-to-right direction of FIG. 1. As shown in FIG. 2 and FIG. 3, the screw hole 4z is provided in the digital substrate 4 so as to avoid the regions in which the various kinds of electrical part are disposed, and the back cover 3 is fixed to the back side of the digital substrate 4 by the screw 12 being tightened in the screw hole 4z.

Figure 7:
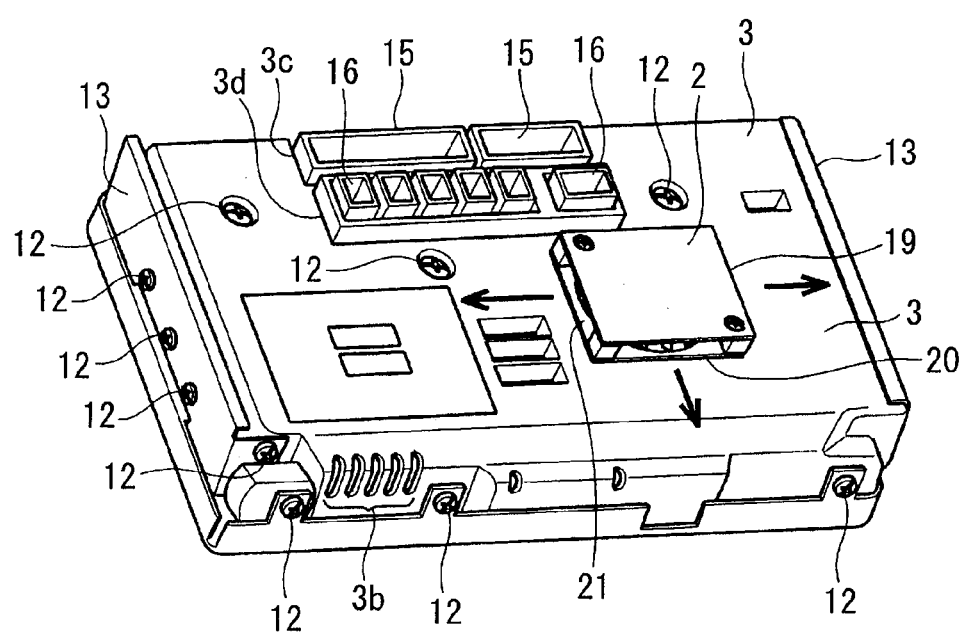
FIG. 7 is a back perspective view of an assembly.
Figure 8:
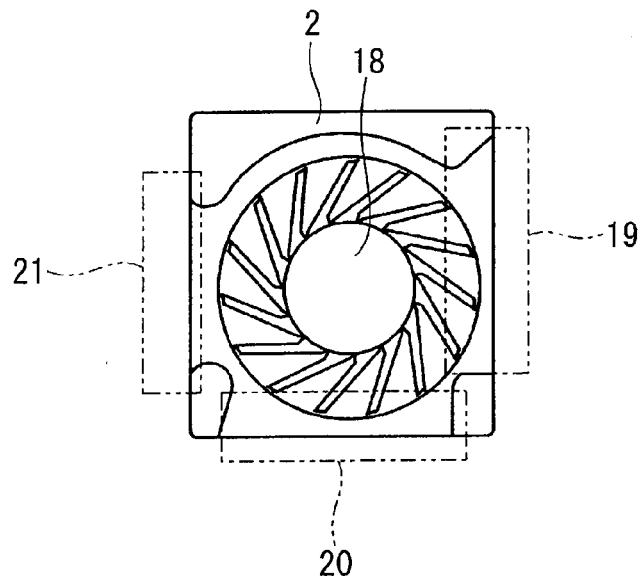
FIG. 8 is a front view of a centrifugal fan unit.

As shown in FIG. 8 illustrating a front view of the centrifugal fan unit 2, the centrifugal fan unit 2 is configured to have a blade (fan) 18 installed inside a cylindrical portion and an approximately square flange. The centrifugal fan unit 2 is resilient to pressure loss, and is secured to have exhaust ports 19, 20, and 21 in the side surfaces respectively by adding cutouts in the three directions. As shown in FIG. 4 and FIG. 7, the centrifugal fan unit 2 protrudes backward from the back surface of the back plate of the back cover 3. Further, by the centrifugal fan unit 2 being installed in this protruding region, air can be exhausted to the rear of the back cover 3 (refer to the arrows of FIG. 7).

Figure 9:
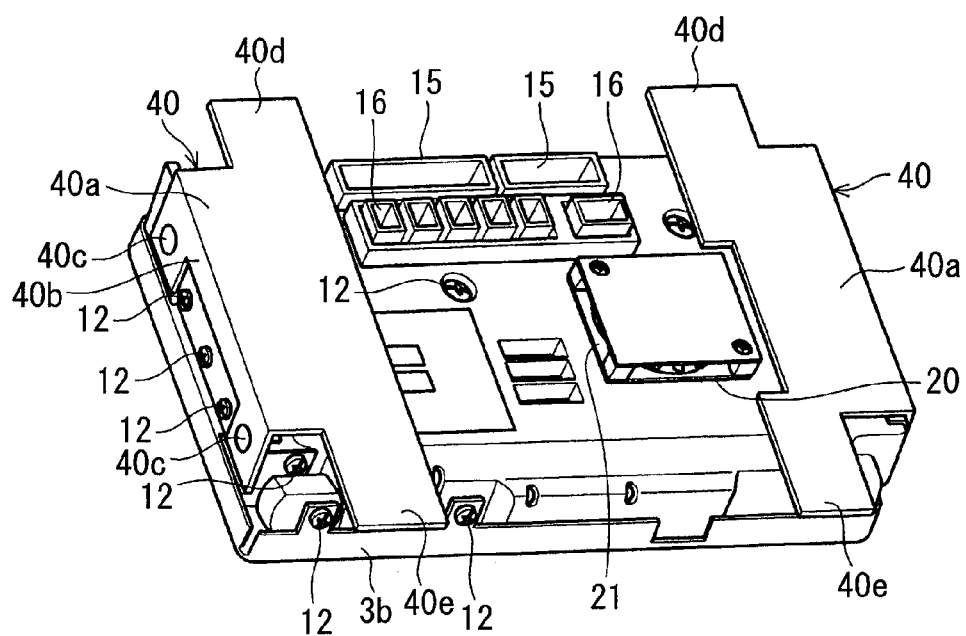
FIG. 9 is a back perspective view showing assembly parts.

The electronic device 1 is fixed to a vehicle using a sheet metal member 40 shown in FIG. 9. The sheet metal member 40 is provided in a pair along either side edge on the back side of the electronic device 1, and the electronic device 1 is fixed to the vehicle using the pair of sheet metal members 40. Each sheet metal member 40 includes, for example, a sheet metal main portion 40a disposed along the back surface of the back cover 3, and an engagement portion 40b that engages along the surface of the side plate 13 (the side surface of the electronic device 1).

The sheet metal main portion 40a and the engagement portion 40b are configured integrally in a state bent at right-angles at corner portions of the electronic device 1 on the back side. The engagement portion 40b includes a fastening portion 40c to be fastened to the side plate 13, and is integrally fixed to the electronic device 1 by the fastening portion 40c. The sheet metal main portion 40a has a portion molded into a rectangular form along the back surface of the back cover 3 as a main body. The sheet metal main portion 40a further includes a protruding piece 40d protruding upward from the upper side of the rectangular portion, and includes a protruding piece 40e protruding downward from lower side of the rectangular portion. Each of the protruding pieces 40d and 40e can be fixed to the vehicle.

Figure 10:
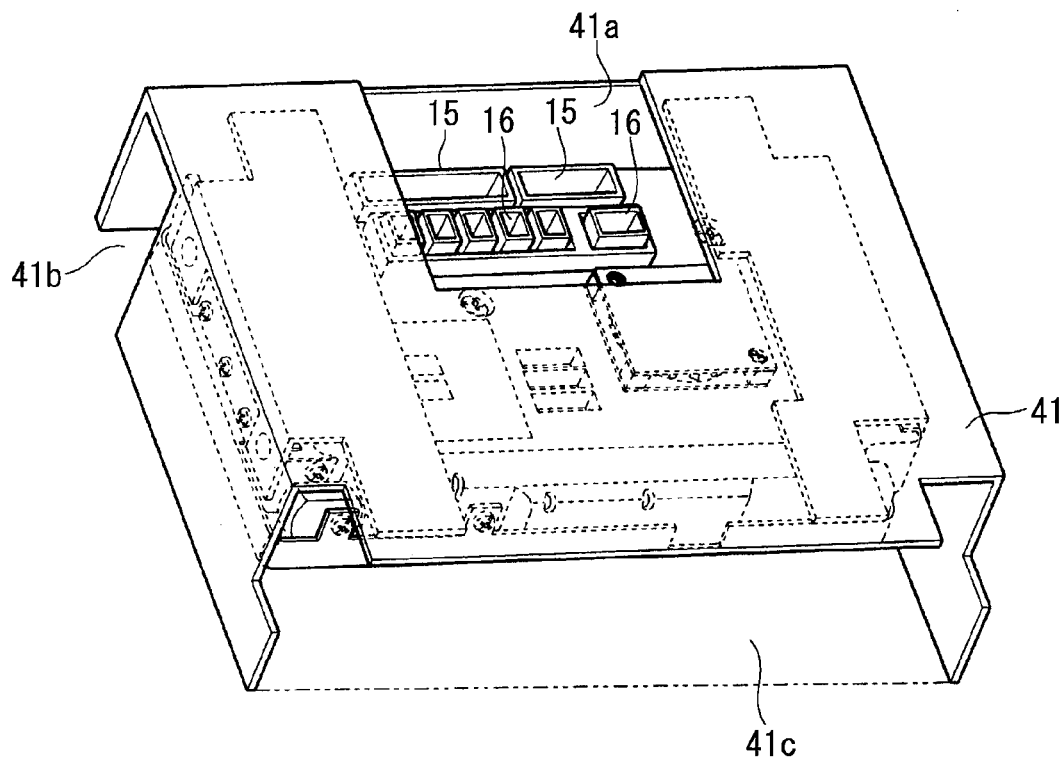
FIG. 10 is a back perspective view showing the electronic device for a vehicle, which is mounted to an object for the vehicle.

The sheet metal member 40 is disposed along the back surface of the electronic device 1. Consequently, exhaust space of the centrifugal fan unit 2 can be secured on the back side of the sheet metal member 40. A mounting target 41 of the electronic device 1 shown in FIG. 10 is a resin molded part provided in a dashboard or the like on the vehicle. A hole 41a is provided in the back surface of the mounting target 41, and a wiring passes through to electrically connected to the connectors 15 and 16. Furthermore, the mounting target 41 has vent holes 41b and 41c for air to pass through in the back surface and the bottom surface respectively. When the electronic device 1 is mounted in the mounting target 41, an exhaust space equivalent to the height of the centrifugal fan unit 2 is provided between the mounting target 41 and the back cover 3 and the sheet metal member 40. When the centrifugal fan unit 2 exhausts air through the exhaust ports 19, 20, and 21, the air is exhausted through the exhaust space and the vent holes 41b and 41c to the outer side of the mounting target 41.

Air flow inside the electronic device 1 will be described while referring to FIG. 4, FIG. 7, and FIG. 11.

Figure 11:
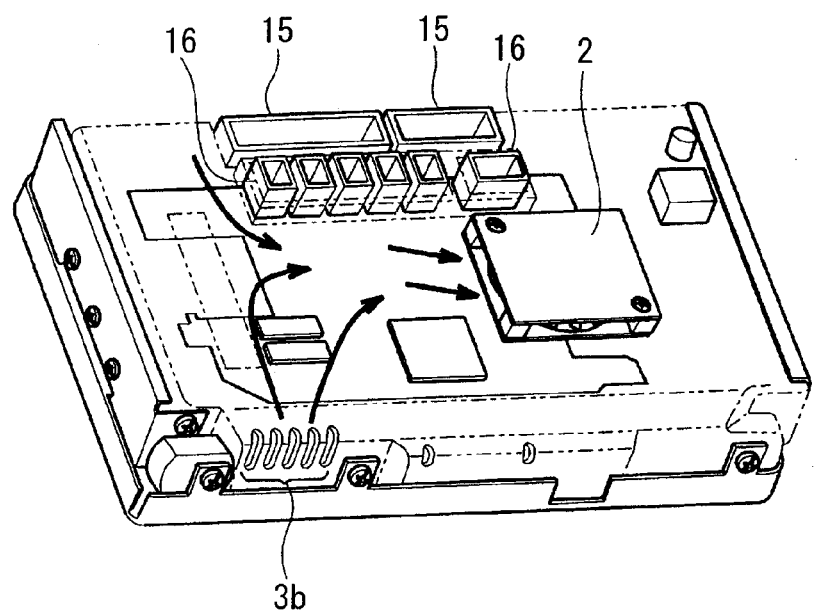
FIG. 11 is a view schematically showing a flow of air inside the electronic device for a vehicle.

When the centrifugal fan unit 2 operates, air flows through the aperture of the back cover 3 to behind the electronic device 1, as shown in FIG. 7 and FIG. 11, to radiate heat. The air is take in from the air inlet 3b in the bottom right surface of the back cover 3 (refer to the air inlet 3b of FIG. 7). The electronic device 1 takes in cooling air from the exterior through the air inlet 3b of the back cover 3. The air inlet 3b is formed in a slit form long in the thickness direction (forward to back direction). Because of this, air passes through the air inlet 3b, and passes through the whole of the inside of the electronic device 1 in the thickness direction. Thus, the air passes mainly along the three paths described below, reaches the centrifugal fan unit 2, and is blown out behind the electronic device 1.

An air flow is shown in sectional view in FIG. 4. Also, in FIG. 11, an internal air flow is shown in perspective view, correlated to FIG. 7. As shown in FIG. 4, air flows in a first path R1 along the back surface of the interface substrate 6.

In the first path R1, air passes between the back surface of the interface substrate 6 and the front surface of the inter-substrate frame 5, along the back surface of the interface substrate 6, and passes through the aperture (cutout) 4a in the right-side end edge of the digital substrate 4. The air passes near the various kinds of electronic part mounted on the back surface of the interface substrate 6, and flows along the metal inter-substrate frame 5. Therefore, the air passes along the first path R1 while being cooled by the frame 5.

A second path R2 is a path in which air flows mainly along the front surface of the digital substrate 4. In the second path R2, air passes between the digital substrate 4 and the inter-substrate frame 5 along the front surface of the digital substrate 4. The air passes either side of the leg portion 5b of the inter-substrate frame 5, and passes through the aperture (cutout) 4a in the right-side end edge of the digital substrate 4. The air passes near the various kinds of electronic part mounted on the front surface of the digital substrate 4. Also, as the air flows along the metal inter-substrate frame 5, the air passes along the second path R2 while being cooled by the frame 5.

A third path R3 is a path in which air flows mainly along the back surface of the digital substrate 4. In the third path R3, air passes between the back surface of the digital substrate 4 and the front surface of the back cover 3 along the back surface of the digital substrate 4, and is sucked in by the centrifugal fan unit 2. In the third path R3, air passes beside the digital substrate 4, and passes along the back surface of the digital substrate 4. The air passes near the various kinds of electronic part mounted on the back surface of the digital substrate 4. Also, as the air flows along the back cover 3, the air passes along the third path R3 while being cooled by the back cover 3. Accordingly, air flows through the first path R1 to the third path R3 in this way, all parts mounted on the front and back surfaces of the digital substrate 4, and on the back surface of the interface substrate 6, can be cooled.

In the embodiment, as shown in FIG. 2, the semiconductor package 33 with the flash memory is positioned beside the aperture 4a on the back surface side of the digital substrate 4. Therefore, when air flows along the third path R3, the air reaches the centrifugal fan unit 2 via the exposed surface of the semiconductor package 33, whereby the semiconductor package 33 can be efficiently cooled.

The semiconductor package 33 is spaced by a distance from the plurality of device elements (the PMIC 30, the CPU 31, and the like) that form heat sources. Furthermore, the position of the semiconductor package 33 is determined by considering the flow of air over the front and back surfaces of the digital substrate 4, the working efficiency of the operator, and the like.

That is, when the operator carries out maintenance of the electronic device 1, a checking probe terminal is brought into contact with a lead pin 33a from the back side of the digital substrate 4 in order to carry out an operation check on the flash memory 33.

The operator can work easily, because a multiple of the lead pin 33a protruding from the semiconductor package 33 is disposed so as to be separated from the bent portion 3a (corresponding to a metal piece, refer to FIG. 2) of the metal back cover 3. Taking this kind of matter into consideration, it is desirable that the arrangement possible region Z of the semiconductor package 33 is provided beside the aperture 4a in the right-side end 4f of the digital substrate 4, and separated from the bent portion 3a.

According to the embodiment, the operational advantages indicated below are achieved. The arrangement possible region Z of the semiconductor package 33 is provided on the inner side of the aperture 4a in the digital substrate 4. Provided that air flows along the third path R3, the air can flow over the exposed surface of the semiconductor package 33, whereby the semiconductor package 33 can be efficiently cooled. Moreover, as the semiconductor package 33 is disposed to distance by the first predetermined distance or more from the CPU 31, and to distance by a second predetermined distance or more from the PMIC 30, the semiconductor package 33 is unlikely to be affected by heat generated by the CPU 31 and the PMIC 30.

When developing a start-up program, a development program is rewritten many times into the flash memory 33. Therefore, it is good when rewriting is made easy. For example, when a problem occurs with data stored in the flash memory 33, the operator may rewrite the program. In this kind of case, rewriting can be carried out easily as the semiconductor package 33 is disposed to be separated from the metal back cover 3 (in particular, the bent portion 3a).

The lead pin 33a of the semiconductor package 33 may be disposed parallel with the metal surface of the metal back cover 3 so that the probe operated by the operator does not come into contact with the back cover 3.

The arrangement possible region Z of the semiconductor package 33 is provided at a position separated by the second predetermined distance and the first predetermined distance (which is smaller than the second predetermined distance) or more from the semiconductor packages 30 and 31 respectively, where cooling performance can be obtained. Therefore, the flash memory 33 can be protected from overheat, and depreciation can be restricted, even when the flash memory 33 is susceptible to heat.

The start-up program of the electronic device 1 is incorporated in the flash memory. The cooling performance can be secured at the maximum by employing the arrangement and distribution structure of the embodiment. The semiconductor package 33 is disposed at an appropriate position, whereby the lifespan of the semiconductor package 33 can be increased, and the semiconductor package 33 can be used for as long as the set lifespan of the vehicle.

The invention claimed is:

1. An electronic device for a vehicle comprising:
   a digital substrate on which electronic components are mounted to have a first semiconductor package with a CPU, a second semiconductor package with a volatile memory readable and writable from the CPU, a third semiconductor package with a flash memory storing a start-up program of the CPU, and a fourth semiconductor package with a power supply management integrated circuit; and
   a fan that takes in air along a surface of the digital substrate on which the first to fourth semiconductor packages are mounted, wherein
   the third semiconductor package is disposed to distance from the first semiconductor package by at least a first predetermined distance and to distance from the fourth semiconductor package by at least a second predetermined distance exceeding the first redetermined distance, and is disposed in a passage of the air taken in by the fan,
   an interface substrate on which a fifth semiconductor package is mounted, the interface substrate being disposed such that the digital substrate and a surface of the interface substrate on which the fifth semiconductor package is mounted are parallel, wherein the digital substrate has an air vent positioned on an outer side of a cut-out end edge formed by cutting out a part of a side of the digital substrate to have a recessed shape, and air passes through the air vent in a thickness direction of the digital substrate, and the fan takes in air along an exposed surface of the fifth semiconductor package mounted on the interface substrate through the air vent of the digital substrate.

2. The electronic device according to claim 1, further comprising:

a plurality of second semiconductor packages including the second semiconductor package, wherein the plurality of second semiconductor packages and the third semiconductor package are disposed along a periphery of the first semiconductor package.

3. The electronic device according to claim 1 further comprising:

a metal piece made of metal, wherein the third semiconductor package has a lead pin protruding outward from the third semiconductor package in a plane, and the lead pin is disposed to distance from the metal piece.

4. The electronic device according to claim 1, wherein the fan is configured of a centrifugal intake fan.

* * * * *